(12) United States Patent
Sukekawa

(10) Patent No.: US 8,383,511 B2
(45) Date of Patent: Feb. 26, 2013

(54) METHOD FOR MANUFACTURING MASK

(75) Inventor: Mitsunari Sukekawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/397,079

(22) Filed: Feb. 15, 2012

(65) Prior Publication Data

US 2012/0149169 A1    Jun. 14, 2012

Related U.S. Application Data

(63) Continuation of application No. 12/954,448, filed on Nov. 24, 2010, now Pat. No. 8,138,094.

(30) Foreign Application Priority Data

Dec. 25, 2009  (JP) ................... 2009-295206

(51) Int. Cl.
*H01L 21/768* (2006.01)
*H01L 21/027* (2006.01)

(52) U.S. Cl. ......... 438/636; 257/E21.024; 257/E21.575; 438/637; 438/702

(58) Field of Classification Search ........... 257/E21.023, 257/E21.024, E21.029, E21.033, E21.035, 257/E21.038, E21.039, E21.575; 438/598, 438/618, 622, 636, 700–703

See application file for complete search history.

(56) References Cited

U.S. PATENT DOCUMENTS 4,545,114 A * 10/1985 Ito et al. ................. 438/301

FOREIGN PATENT DOCUMENTS

| JP | 09-213609 A | 8/1997 |
| JP | 2009-238998 A | 8/1997 |
| JP | 11-150191 A | 6/1999 |
| JP | 2007-335628 A | 12/2007 |
| JP | 2008-198991 A | 8/2008 |

\* cited by examiner

*Primary Examiner* — Julio J Maldonado
*Assistant Examiner* — Daniel Shook
(74) *Attorney, Agent, or Firm* — Sughrue Mion, PLLC

(57) ABSTRACT

Openings are formed in first and second mask layers. Next, diameter of the opening in the second mask layer is enlarged so that the diameter of the opening in the second mask layer becomes larger by a length X than diameter of the opening in the first mask layer. Thereafter, mask material is formed into the opening in the second mask layer, to form a cavity with a diameter X within the opening in the second mask layer. There is formed a mask which includes the second mask layer and the mask material having therein opening including the cavity.

18 Claims, 12 Drawing Sheets

METHOD FOR MANUFACTURING MASK

This application is a Continuation of U.S. application Ser. No. 12/954,448 filed Nov. 24, 2010 which is based upon and claims the benefit of priority from Japanese Patent Application No. 2009-295206, filed on Dec. 25, 2009, the disclosure of which is incorporated herein in its entirety by reference.

TECHNICAL FIELD

The invention relates to a method for manufacturing a mask.

BACKGROUND ART

Conventionally, in the field of the semiconductor device, a hole forming method using a mask including a fine opening pattern has been studied.

Japanese Patent Laid-Open No. 2009-238998 discloses the hole forming method. In this method, a film, a metal film, and a resist mask are formed on base material. Then, the metal film is subjected to dry etching using the resist mask, and, at the same time, the retreat amount of the resist mask by the dry etching is controlled, resulting in forming opening with side surface which has first and second tilt angles.

Japanese Patent Laid-Open No. 2008-198991 discloses the hole forming method. This method comprises forming a first pattern, forming spacers on a side wall of the first pattern, forming a second pattern by filling with an insulating film into a gap between the spacers, removing the spacer in a contact hole region, and forming a contact hole by etching using the first and second patterns and the spacer.

Japanese Patent Laid-Open No. 2007-335628 discloses the method for forming the contact hole. In this method, a first resist film is formed on an insulating film, and, then, a second resist film is formed on the first resist film. Next, a first opening is formed in the second resist film using a first photolithography method and a second opening is formed in the first resist film using a second photolithography method, resulting in forming an overhang portion in the second resist film. Thereafter, a mortar-shape contact hole is formed in the insulating film by selectively removing the insulating film using a reactive ion etching method.

SUMMARY OF THE INVENTION

In one embodiment, there is provided a method for manufacturing a mask, comprising:

forming a second mask layer and a first mask layer in this order on a first film;

patterning the first and second mask layers to form openings in the first and second mask layers;

enlarging diameters of the openings in the second mask layer so that the diameters of the openings in the second mask layer become larger than diameters of the openings in the first mask layer;

depositing mask material into the openings in the first and second mask layers so that cavities are formed within the openings in the second mask layer;

etching back the first mask layer and the mask material so that the second mask layer remains, to remove the first mask layer and to expose the cavities in the second mask layer; and removing the mask material from bottom surfaces of the cavities in a thickness direction of the mask material until the first film is exposed, to form a mask which includes the second mask layer and the mask material and has the openings including the cavities on the first film.

In another embodiment, there is provided a method for manufacturing a mask, comprising:

forming a second mask layer and a first mask layer in this order on a first film, the second and first mask layers including therein openings;

performing an isotropic etching of the second mask layer so that diameters of the openings in the second mask layer become larger than diameter of the openings in the first mask layer; and removing the first mask layer so that the second mask layer remains and providing mask material on side walls of the openings in the second mask layer so that cavities are formed in the openings in the second mask layer, to form a mask which includes the second mask layer and the mask material and includes openings comprising therein the cavities.

BRIEF DESCRIPTION OF THE DRAWINGS

The above features and advantages of the present invention will be more apparent from the following description of certain preferred embodiments taken in conjunction with the accompanying drawings, in which.

Figure 1A:
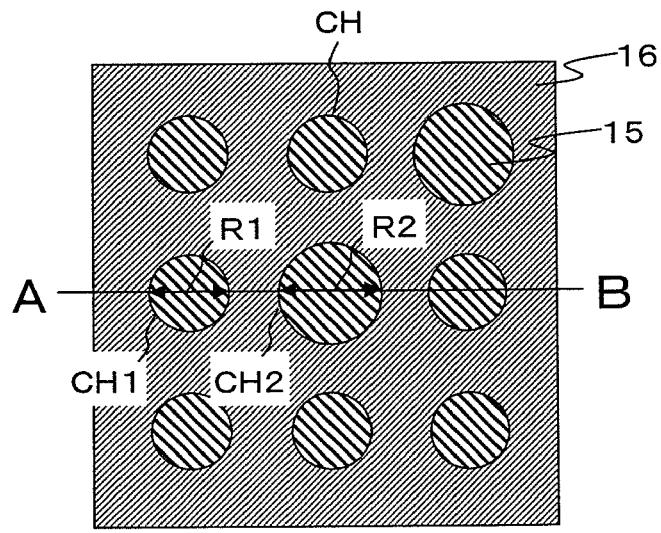
FIG. 1A and FIG. 1B are views illustrating a method for manufacturing a semiconductor device according to a first exemplary embodiment of the invention.

In the drawings, reference numerals have the following meanings: 1, 10: silicon substrate, 2, 11: interlayer insulating film, 3, 12: amorphous carbon film, 4, 13: silicon oxynitride film, 5, 16: photoresist, 14: anti-reflection film, 15: organic film, 17: silicon oxide film, 18a, 18b: opening, 18c: first holes, 101: P type silicon substrate, 102: isolation region, 103: gate insulating film, 104: gate electrode, 105, 106, 107, 108, 109: diffusion layers, 110, 111, 112: transistors, 113: first interlayer insulating film, 114, 115, 121, 130, 132: contact hole, 116, 117, 131, 133: contact plug, 118: bit line, 119: first interconnection, 120: second interlayer insulating film, 122: capacitive contact plug, 123: third interlayer insulating film, 124: cylinder hole, 125: lower electrode, 126: capacitive insulating film, 127: upper electrode, 128: fourth interlayer insulating film, 129: drawn interconnection, 134, 135: second interconnections, A: memory cell region, B: peripheral circuit region, CH1, CH1a, CH2, CH2a: opening, R1, R2: diameter, X: diameter of cavities

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In addition, the exemplary embodiments below will be explained by dividing them into a plurality of sections or embodiments if necessary for convenience. They should not be construed as not being related to one another, and are in relations of modified embodiments of parts or the entirety thereof, detailed explanation, and supplemental explanations, etc., unless otherwise expressly described herein.

In a method for manufacturing a mask, openings are formed in first and second mask layers. At this time, there occurs variation between the opening diameters. Thereafter, by a diameter enlarging process, the opening diameters in the second mask layer become larger by a length X than the opening diameters in the first mask layer. Subsequently, mask material is formed in the openings in the second mask layer. At this time, the mask material is formed in the openings in the second mask layer until the openings in the first mask layer have been completely buried with the mask material.

Herein, when the openings in the first mask layer is completely buried with the mask material, the amount of the mask material corresponding to the opening diameters in the first mask layer is formed on inner walls of the openings in the first mask layer. Thus, in the same manner, the mask material with thickness corresponding to the opening diameters in the first mask layer is also formed on inner walls of the openings in the second mask layer.

As mentioned above, by the diameter enlarging process, the opening diameters in the second mask layer become larger by the length X than the opening diameters in the first mask layer. Therefore, at the time when the formation of the mask material in the openings of the first and second mask layers has been finished up, the openings in the second mask layer are not completely buried with the mask material, resulting in forming cavities having diameter of X in the second mask layer. Accordingly, although before or after the diameter enlarging process, there occurs variation between the opening diameters in the first and second mask layers, all of the cavities in the second mask layer become the same as the laterally etched amount X of the second mask layer by the diameter enlarging process. That is, the diameters of the cavities become uniform. Thus, by using as a mask the second mask layer including therein the cavities as openings thereof and the mask material, it is possible to manufacture the mask with opening pattern which has uniform opening diameter and is easy to control the opening diameter and is suitable to the miniaturization of the semiconductor device.

Below, exemplary embodiments of the invention will be described with reference to the drawings. Meanwhile, the following exemplary embodiments are merely specific examples for making the invention understood more deeply, and, accordingly, the invention is not limited to such exemplary embodiments.

First Exemplary Embodiment

As shown in FIG. 1, interlayer insulating film 11 was formed on silicon substrate 10 using CVD method. Next, using CVD method, amorphous carbon film 12 (corresponding to a second film) with 200 nm thickness was formed on interlayer insulating film 11. Then, silicon oxynitride film 13 (corresponding to a first film) with 30 nm thickness was formed on amorphous carbon film 12. Using a spin coating method, organic anti-reflection film 14 (corresponding to a second mask layer) with 200 nm thickness was formed on silicon oxynitride film 13. Then, silicon-containing organic film 15 (corresponding to a first mask layer) with 30 nm thickness was formed on organic anti-reflection film 14. After forming photoresist film 16 on silicon-containing organic film 15, an opening pattern with openings was formed by a lithography method in a region corresponding to a semiconductor device formed in and on silicon substrate 10.

Figure 1B:
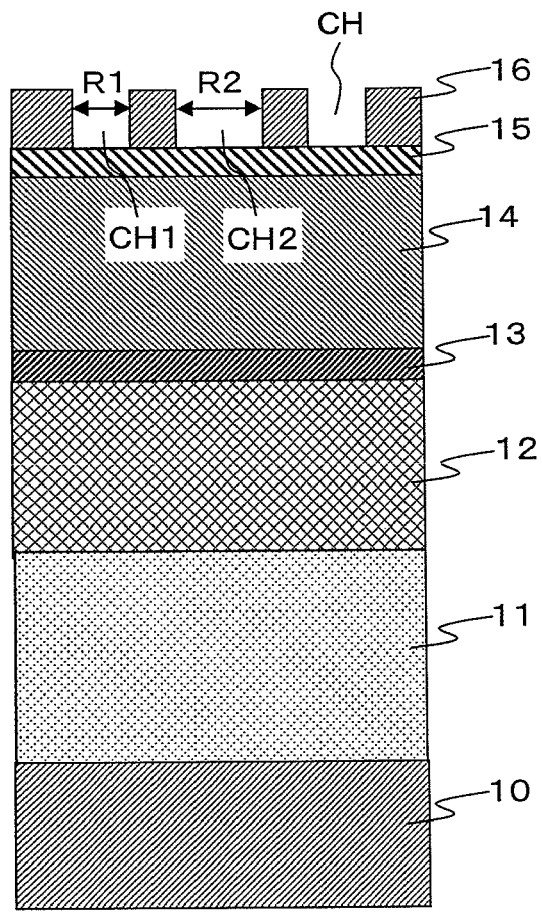

FIG. 1A is a top view of the opening pattern, and FIG. 1B is a cross-sectional view of the opening pattern taken at a line A-B of FIG. 1A. Meanwhile, in the figures following FIG. 1, the semiconductor device formed in and on the silicon substrate 10 is omitted. Also, in the figures following FIG. 1, the figures represented as the character "A" will be the top views of the opening pattern, and the figures represented as the character "B" will be the cross-sectional views of the opening pattern taken at a line A-B of the associated top views. Depending on the figures, silicon substrate 10 and interlayer insulating film 11 are omitted.

As shown in FIG. 1A, there occurs the variation between the opening diameters in photoresist film 16, and, hence, the openings with two different diameters were formed such as opening CH1 with diameter R1 and opening CH2 with diameter R2. For example, in case that using a liquid immersion exposure apparatus employing ArF as its light source, variation in the opening diameters becomes ±8 nm, and, thus, a maximum difference between the opening diameters becomes 16 nm.

Figure 2A:
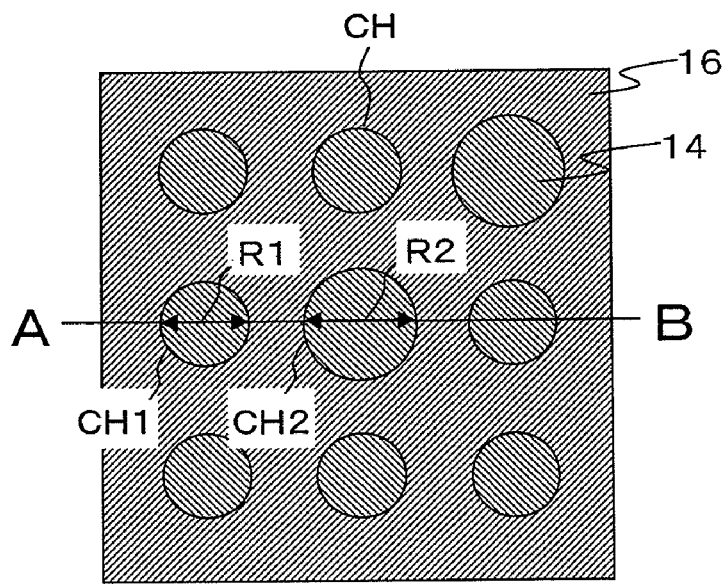
FIG. 2A and FIG. 2B are views illustrating the method for manufacturing the semiconductor device according to the first exemplary embodiment of the invention.
Figure 2B:
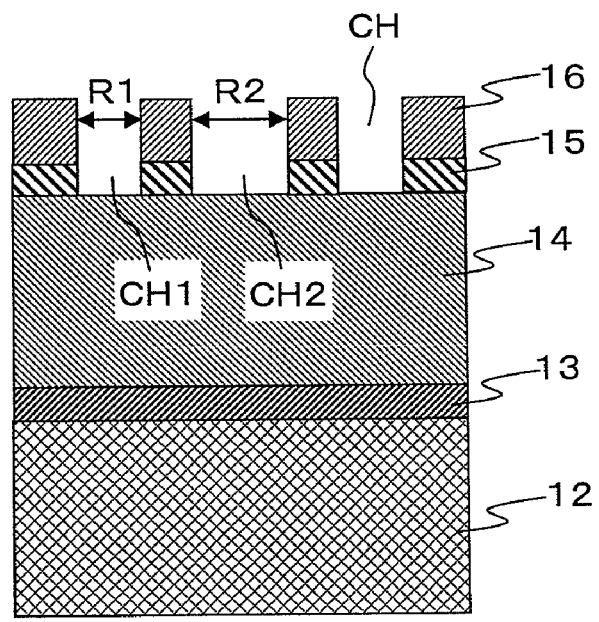

As shown in FIG. 2A and FIG. 2B, the opening pattern was transferred into silicon-containing organic film 15 by a dry etching method using photoresist film 16 and $CF_4$ gas as a mask and etching gas, respectively. This opening pattern has the opening diameters substantially equal to the opening diameters in photoresist film 16.

Figure 3A:
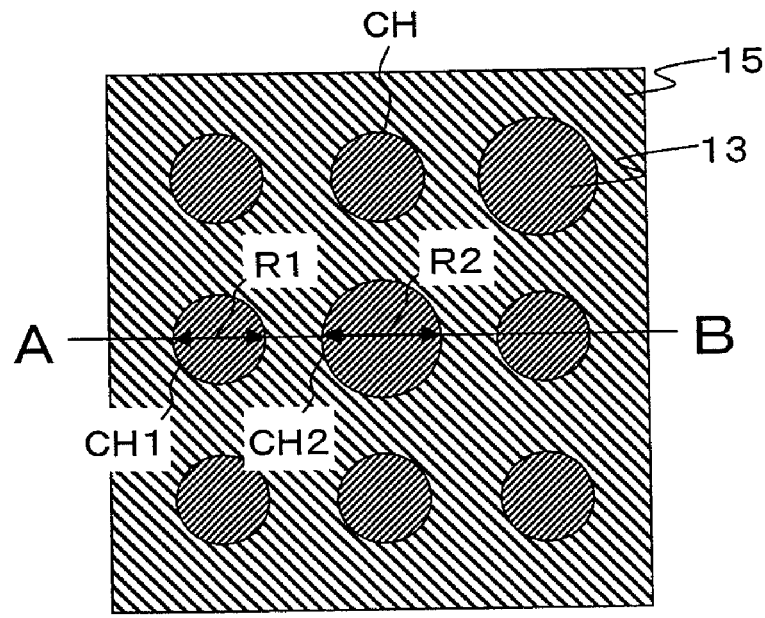
FIG. 3A and FIG. 3B are views illustrating the method for manufacturing the semiconductor device according to the first exemplary embodiment of the invention.
Figure 3B:
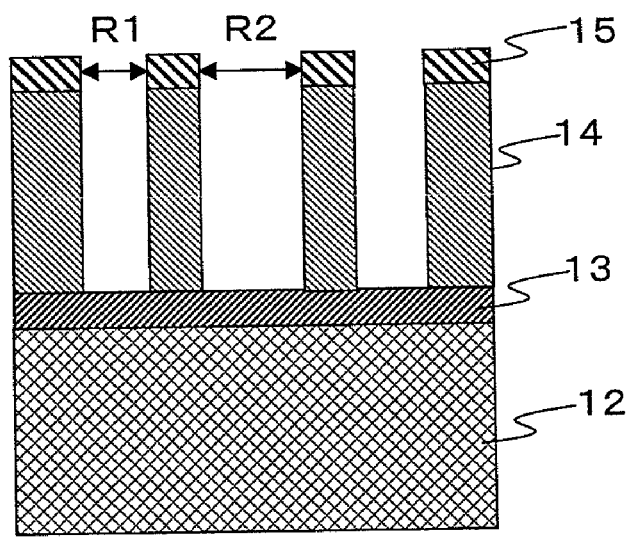

As shown in FIG. 3A and FIG. 3B, after removing photoresist film 16, the opening pattern was transferred into organic anti-reflection film 14 by a dry etching method using silicon-containing organic film 15 as a mask. At this time, in organic anti-reflection film 14, there was formed the opening pattern with the opening diameters substantially equal to the opening diameters in silicon-containing organic film 15.

Figure 4A:
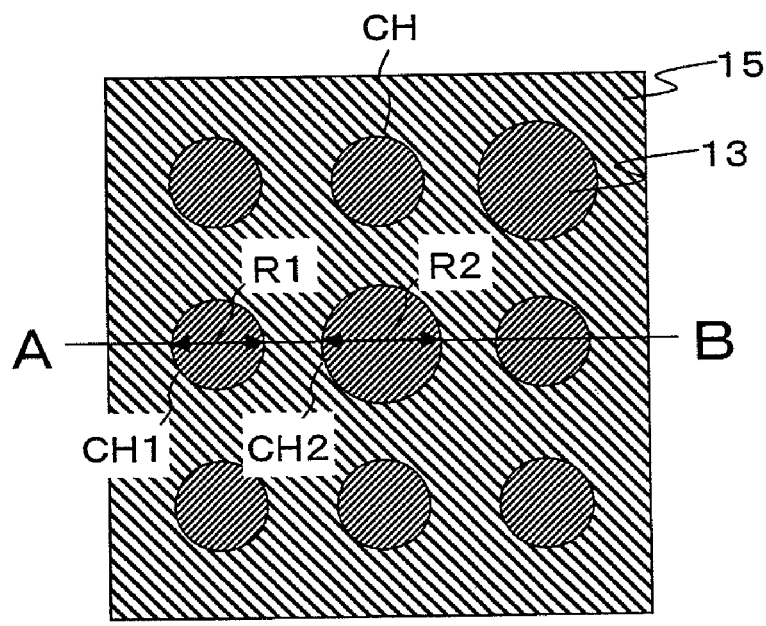
FIG. 4A and FIG. 4B are views illustrating the method for manufacturing the semiconductor device according to the first exemplary embodiment of the invention.
Figure 4B:
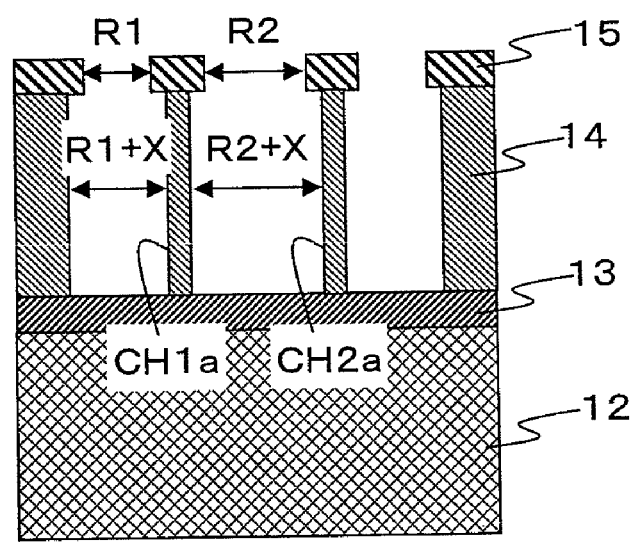

As shown in FIG. 4A and FIG. 4B, organic anti-reflection film 14 was subjected to a dry etching using oxygen gas as etching gas (the diameter enlarging process). At this time, since the reaction level between organic anti-reflection film 14 and oxygen radicals is high, organic anti-reflection film 14 was etched away in an isotropic way, so that organic anti-reflection film 14 was removed uniformly in a lateral direction by constant amount X. As a result, in organic anti-reflection film 14, openings CH1 with diameter R1 and openings CH2 with diameter R2 became openings CH1a with diameter R1+X and openings CH2a with diameter R2+X, respectively.

Figure 5A:
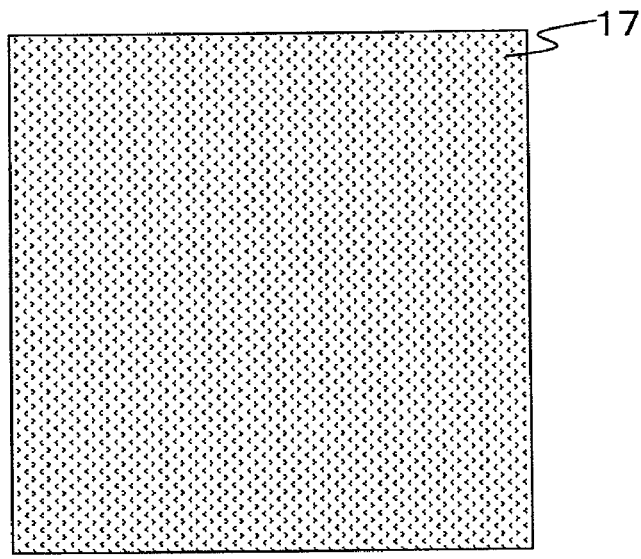
FIG. 5A and FIG. 5B are views illustrating the method for manufacturing the semiconductor device according to the first exemplary embodiment of the invention.
Figure 5B:
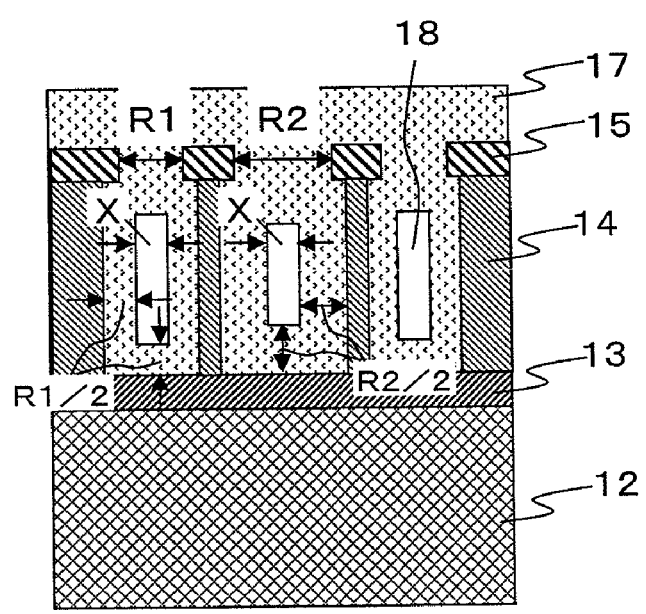

As shown in FIG. 5A and FIG. 5B, silicon oxide film 17 (corresponding to the mask material) was deposited on an entire face of the resultant structure by using ALD-CVD method, and was deposited into each of openings CH1a, CH2a. At this time, silicon oxide film 17 was deposited on the inner walls of the openings in organic anti-reflection film 14 until the openings in silicon-containing organic film 15 have been completely buried with silicon oxide film 17. Herein, when the amount of silicon oxide film 17 corresponding to the opening diameters in silicon-containing organic film 15 has been formed on the inner walls of the openings in silicon-containing organic film 15, the openings in silicon-containing organic film 15 have been completely buried with silicon oxide film 17.

Thus, in the same manner as in the openings in silicon-containing organic film 15, there was formed silicon oxide film 17 with thickness corresponding to the opening diameters in silicon-containing organic film 15, on the inner walls of the openings in organic anti-reflection film 14. Herein, by the previous diameter enlarging process, the opening diameters in organic anti-reflection film 14 became larger by the length X than the opening diameters in silicon-containing organic film 15. Therefore, silicon oxide film 17 having thicknesses of R1/2 and R2/2 had been deposited on the inner walls of openings CH1a, CH2a in organic anti-reflection film 14, respectively. Further, the openings in organic anti-reflection film 14 were not completely buried with silicon oxide film 17, so that cavities having diameter of X were formed in organic anti-reflection film 14.

Accordingly, although before or after the diameter enlarging process, there occurs variation such as R1 between the opening diameters in organic anti-reflection film 14 and variation such as R2 between the opening diameters in silicon-containing organic film 15, all of the diameters of the cavities formed became the same as the laterally etched amount X of organic anti-reflection film 14 by the diameter enlarging process (the laterally etched amount X corresponds to the difference between the opening diameters in organic anti-reflection film 14 and the opening diameters in silicon-containing organic film 15). That is, the diameters of the cavities became uniform.

Figure 6A:
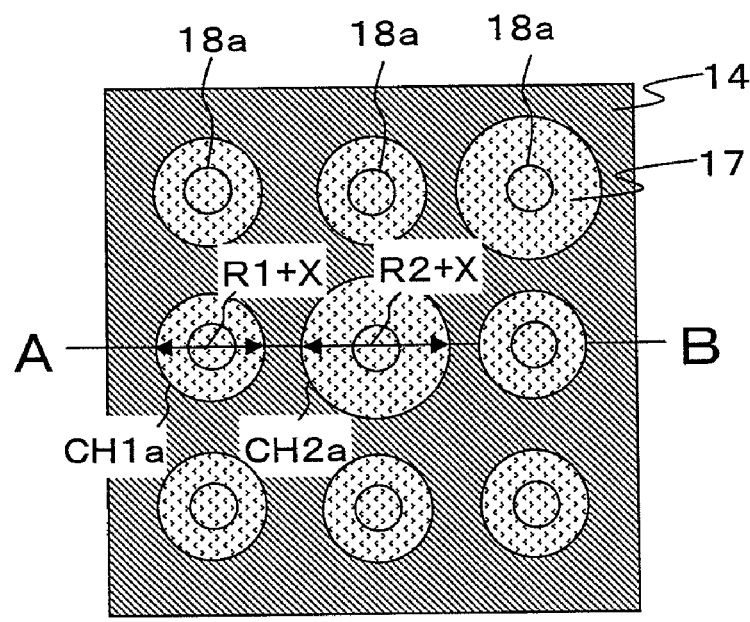
FIG. 6A and FIG. 6B are views illustrating the method for manufacturing the semiconductor device according to the first exemplary embodiment of the invention.
Figure 6B:
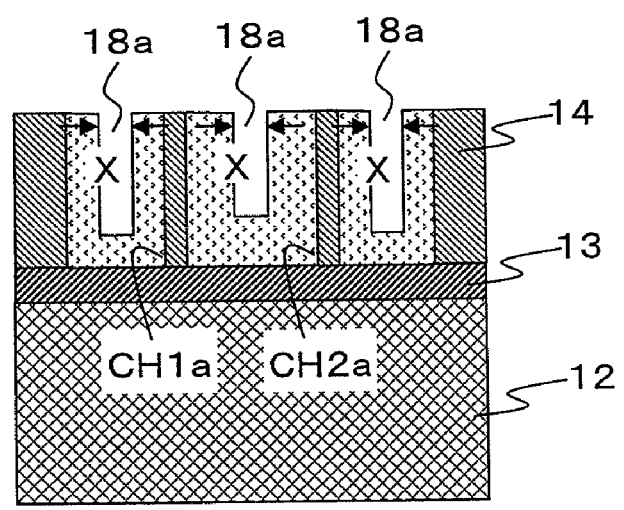

As shown in FIG. 6A and FIG. 6B, by a dry etching method, silicon oxide film 17 was etched back, and, further, silicon-containing organic film 15 was removed to form openings 18a. All of openings derived from openings CH1a, CH2a had the same diameter as the length X which was the diameters of the cavities.

Figure 7A:
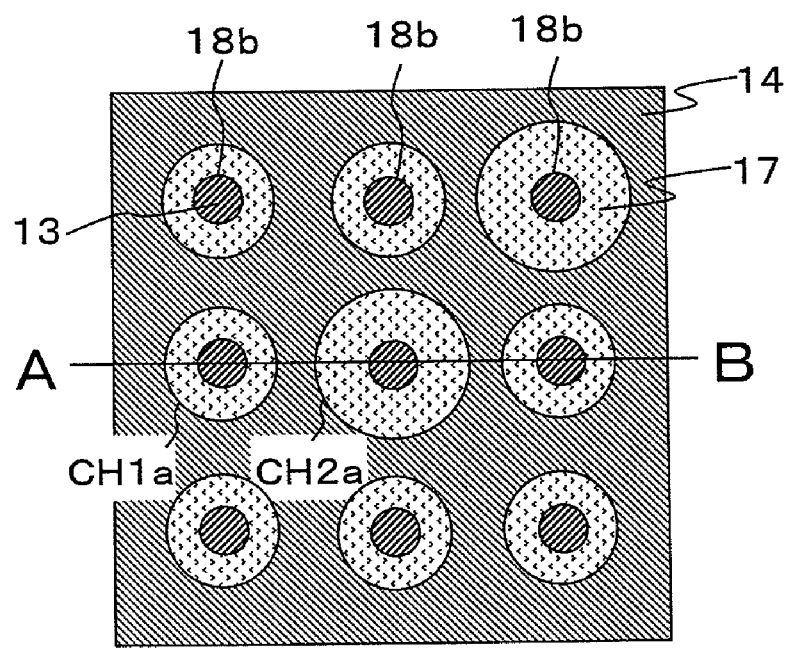
FIG. 7A and FIG. 7B are views illustrating the method for manufacturing the semiconductor device according to the first exemplary embodiment of the invention.
Figure 7B:
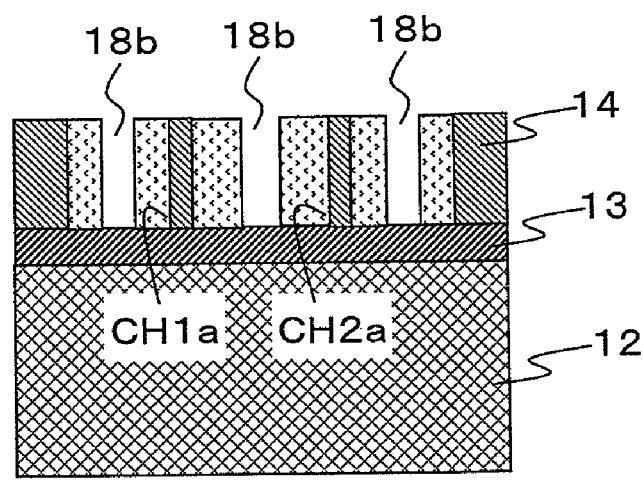
Figure 8A:
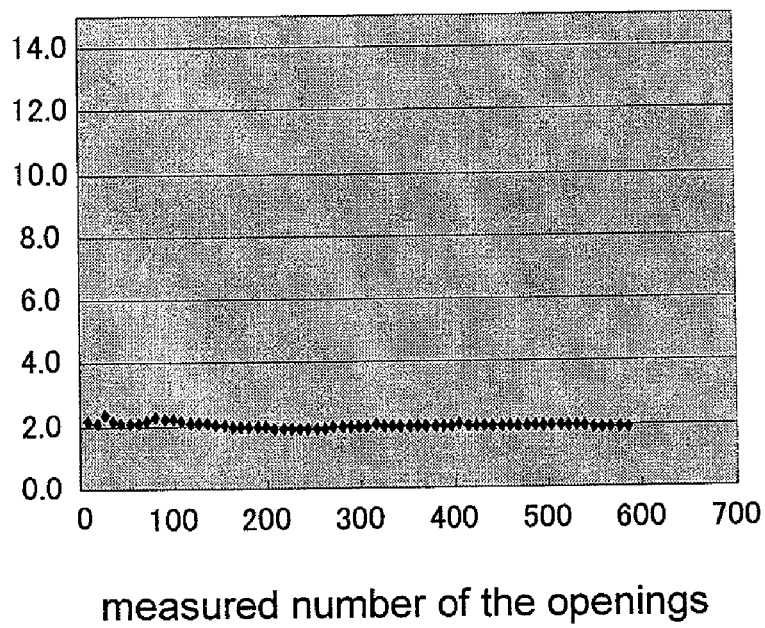
FIG. 8A and FIG. 8B are views illustrating the method for manufacturing the semiconductor device according to the first exemplary embodiment of the invention.
Figure 8B:
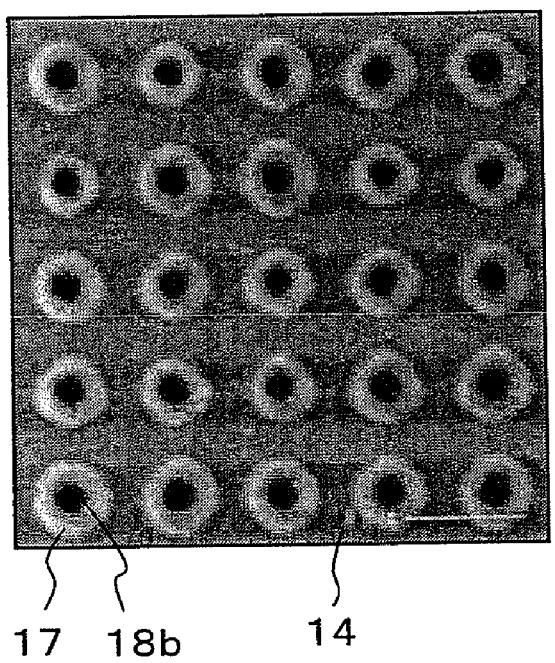

As shown in FIG. 7A and FIG. 7B, by a dry etching method, silicon oxide film 17 at bottom surfaces of openings 18a was etched back and, further, an opening pattern with openings 18b having diameter of X was formed. An electronic micrograph of such formed opening pattern is shown in FIG. 8B. FIG. 8A is a graph showing variation (3σ) between the opening diameters in the opening pattern. As shown in FIG. 8A, the variation (3σ) is 2, and, thus, such formed opening pattern has very small non-uniformity degree between the opening diameters.

Figure 9A:
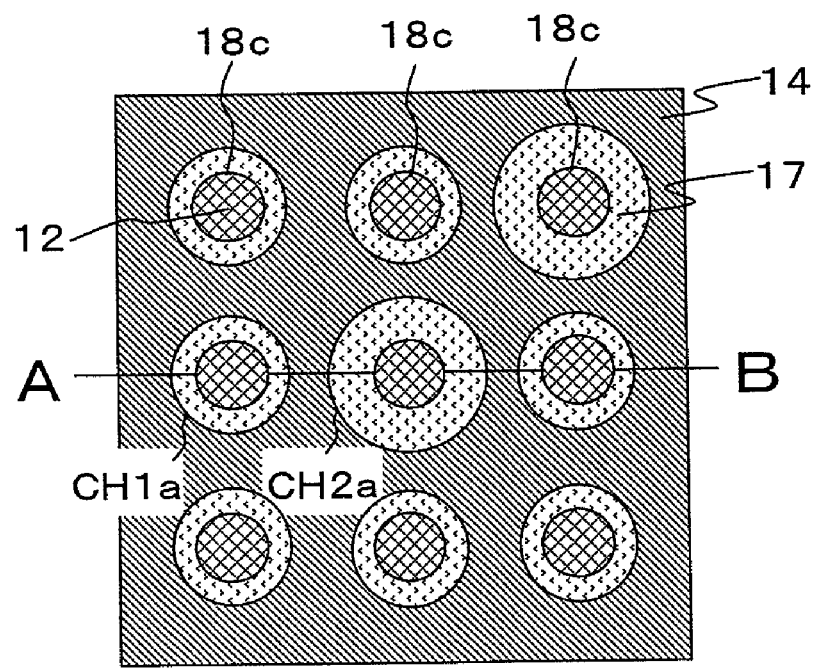
FIG. 9A and FIG. 9B are views illustrating the method for manufacturing the semiconductor device according to the first exemplary embodiment of the invention.
Figure 9B:
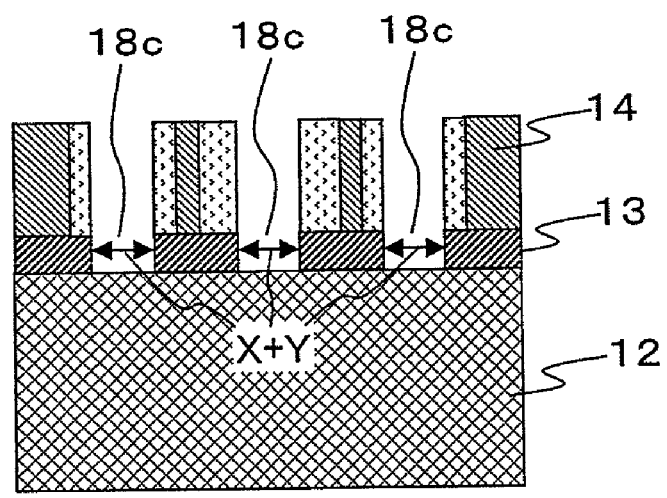

As shown in FIG. 9A and FIG. 9B, using a dry etching, silicon oxynitride film 13 was etched away by etched amount Y/2. At this time, silicon oxide film 17 was also etched away by etched amount Y/2, resulting in forming first holes 18a having uniform diameter of X+Y.

Figure 10A:
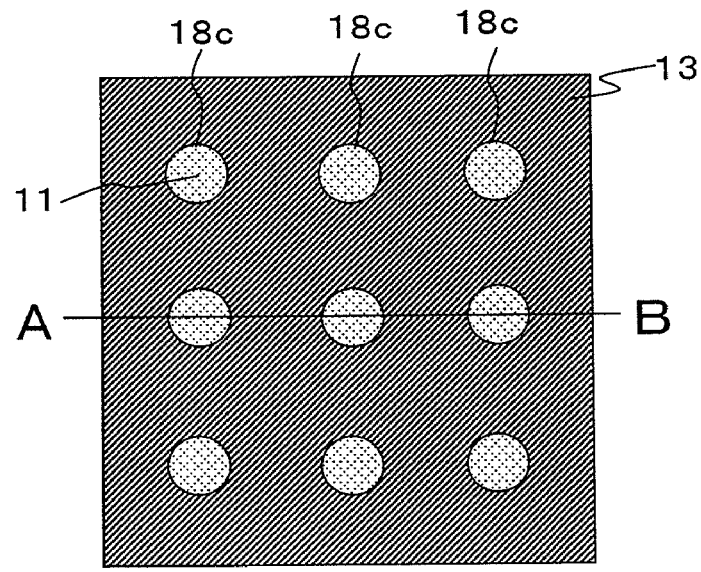
FIG. 10A and FIG. 10B are views illustrating the method for manufacturing the semiconductor device according to the first exemplary embodiment of the invention.
Figure 10B:
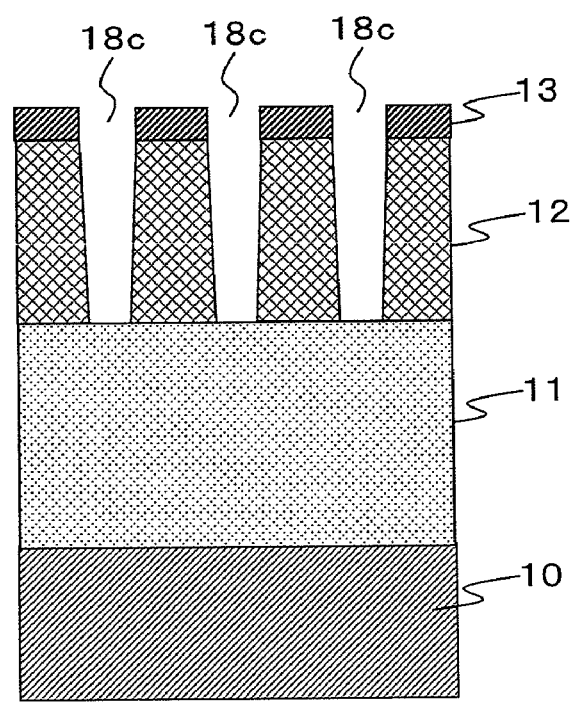

As shown in FIG. 10A and FIG. 10B, after removing silicon oxide film 17 and organic anti-reflection film 14, second holes 18c were formed in amorphous carbon film 12 by a dry etching using silicon oxynitride film 13 as a mask. At this time, since the diameters of the first holes formed in silicon oxynitride film 13 were uniform, it was possible to form the second holes which have uniform diameters and reach interlayer insulating film 11 in amorphous carbon film 12.

Figure 11A:
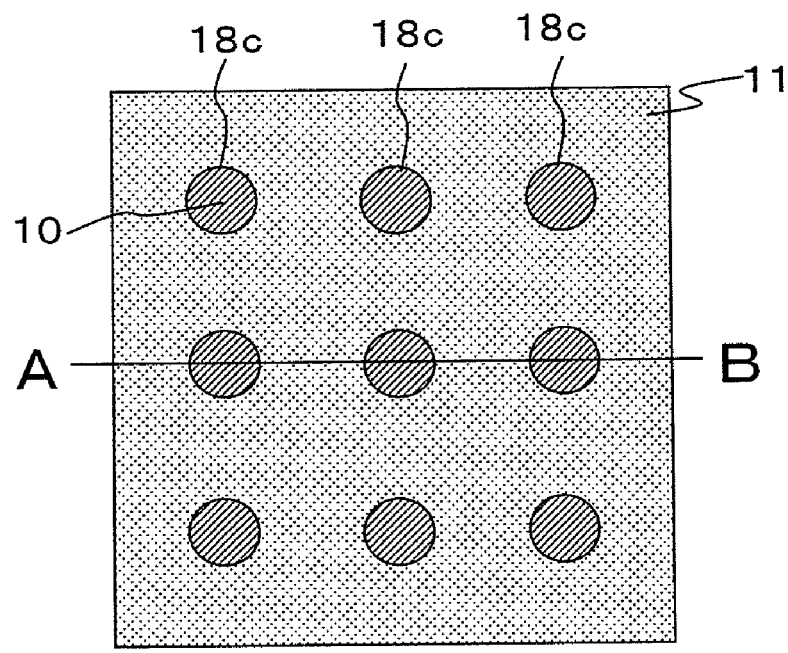
FIG. 11A and FIG. 11B are views illustrating the method for manufacturing the semiconductor device according to the first exemplary embodiment of the invention.
Figure 11B:
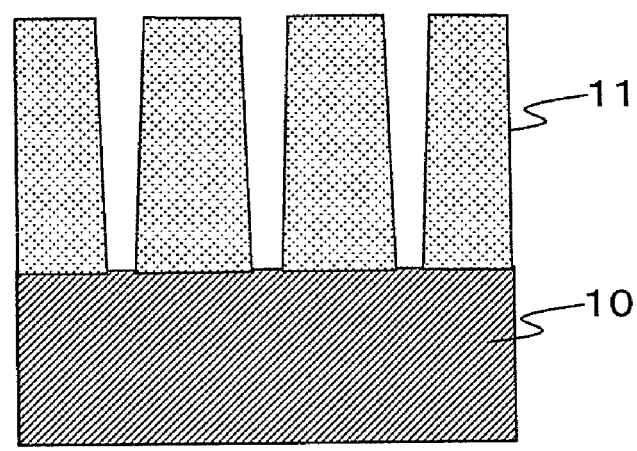

As shown in FIG. 11A and FIG. 11B, after removing silicon oxynitride film 13, holes were formed in interlayer insulating film 11 by a dry etching using amorphous carbon film 12 as a mask. At this time, since the diameters of the second holes formed in amorphous carbon film 12 were uniform, it was possible to form contact holes which have uniform diameters and reach silicon substrate 10 in interlayer insulating film 11.

As described above, according to the present exemplary embodiment, it was possible to manufacture the mask with opening pattern which has uniform opening diameter and is easy to control the opening diameter and is suitable to the miniaturization of the semiconductor device.

Second Exemplary Embodiment

Figure 12:
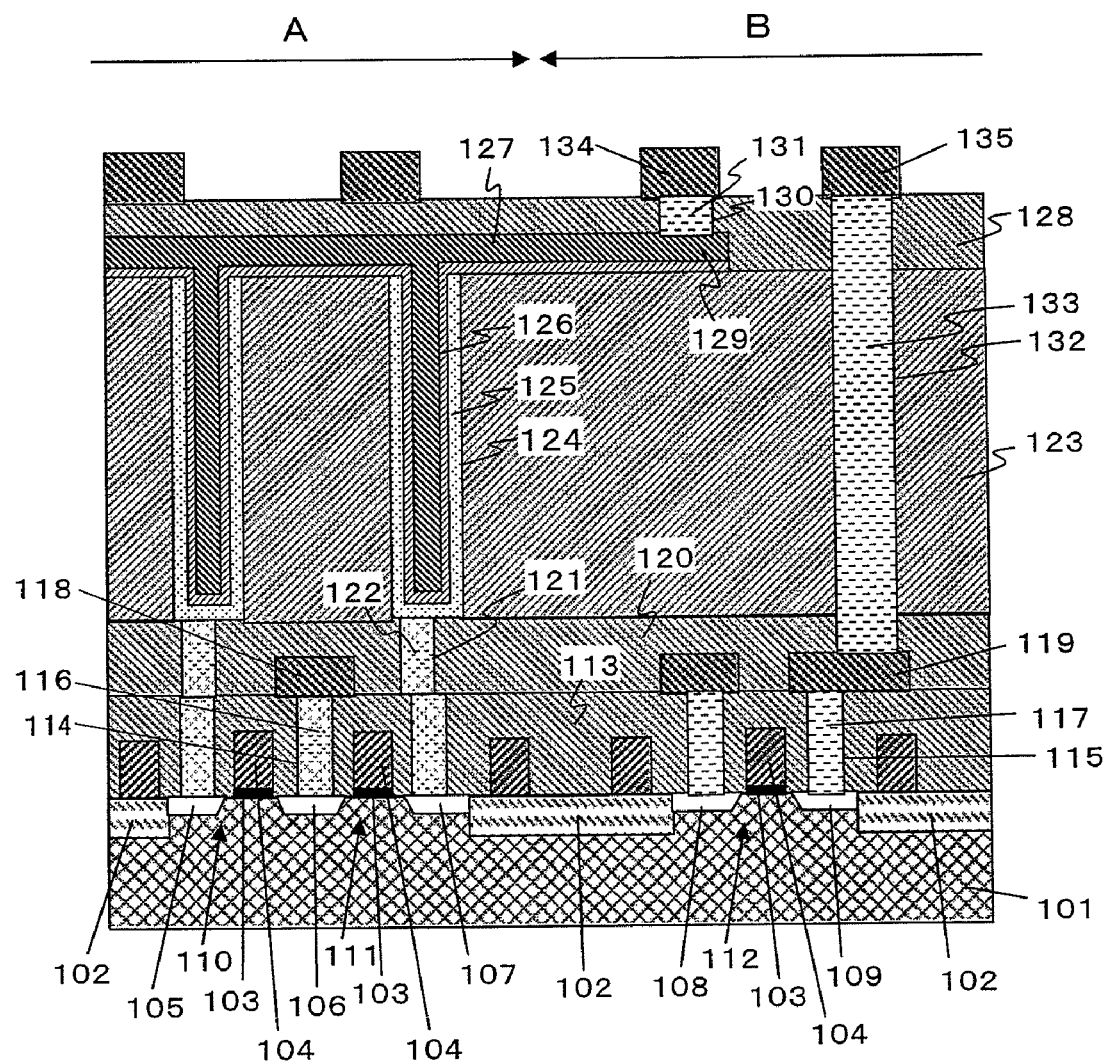
FIG. 12 is a view illustrating a semiconductor device according to a second exemplary embodiment of the invention.

This exemplary embodiment relates to a method for manufacturing a DRAM as a semiconductor device. This exemplary embodiment will be described with reference to a schematic cross-sectional view of FIG. 12. A left half of FIG. 12 shows memory cell region A, while a right half of FIG. 12 shows peripheral circuit region B.

After forming an isolation region 102 for identifying an active region in P type silicon substrate 101, gate insulating films 103 were formed on the surface of the silicon substrate using a thermal-oxidation method. Next, conductive material was formed on the entire surface of the resultant structure using well-known CVD or sputtering methods. Then, gate electrodes 104 being word lines were formed by a well-known lithography method and a dry etching method.

Subsequently, impurities such as phosphorus, arsenic, boron or the like were implanted in the surface of silicon substrate 101 by an ion implanting method using gate electrodes 104 as a mask, and, then, the resultant structure was subjected to heat treatment to form diffusion layers 105, 106, 107, 108, and 109 being sources/drains.

In this way, in memory cell region A, transistors 110, 111 sharing diffusion layer 106 with each other were formed, and, in peripheral circuit region B, transistor 112 was formed.

Next, using well-known CVD or spin coating methods, first interlayer insulating film 113 was formed on the entire surface of the resultant structure so as to cover all of the transistors. Thereafter, the surface of the resultant structure was planarized using a well-known CMP method. Then, contact holes 114, 115 were formed using the method of the invention. Contact holes 114 in memory cell region A were formed so as to expose portions of upper surfaces of diffusion layers 105, 106, 107 formed in the silicon substrate. Contact holes 115 in peripheral circuit region B were formed so as to expose portions of upper surfaces of diffusion layers 108, 109.

At the following, conductive material was formed on an entire surface of the resultant structure so as to fill contact holes 114, 115 with conductive material, and, then, the conductive material formed on the upper surface of first interlayer insulating film 113 was removed using a CMP method to form contact plugs 116, 117.

Subsequently, a first interconnection layer was formed on an entire surface of the resultant structure using CVD or sputtering methods, and, then, interconnections were formed by lithography and dry etching methods. In this manner, bit line 118 was formed in memory cell region A, and first interconnection 119 was formed in peripheral circuit region B.

Contact hole 114 was formed as hole for forming contact plug 116 interconnecting the lower conductive layer including diffusion layer 106 and the upper conductive layer including bit line 118 with each other. Contact holes 115 were formed as holes for forming contact plugs 117 interconnecting the lower conductive layers including diffusion layers 108 and 109 and the upper conductive layers including first interconnection 119 with each other. These contact holes 114, 115 were formed in first interlayer insulating film 113 between silicon substrate 101, and bit line 118 and first interconnection 119.

Next, using CVD or spin coating methods, second interlayer insulating film 120 was formed on an entire surface of the resultant structure so as to cover bit line 118 and first interconnection 119. Thereafter, the surface of the resultant structure was planarized using a CMP method. Then, in memory cell region A, contact holes 121 were formed using the method of the invention. Contact holes 121 were formed so as to expose portions of upper surfaces of contact plugs 116 in first interlayer insulating film 113.

Subsequently, conductive material was formed on an entire surface of the resultant structure so as to fill contact holes 121 with conductive material. Then, the conductive material formed on the upper surface of second interlayer insulating film 120 was removed using a CMP method, thereby forming capacitive contact plugs 122.

Then, using a CVD method, third interlayer insulating film 123 was formed on an entire surface of the resultant structure. In order to increase capacitances of capacitors due to increase of area of lower electrodes, thickness of third interlayer insulating film 123 was set to be in a range of 2 to 3 µm. The third interlayer insulating film 123 had thickness of four times or more than four times as large as the thicknesses of first and second interlayer insulating films 113, 120. After forming third interlayer insulating film 123, cylinder holes 124 to be capacitors in memory cell region A were formed using the method of invention. Cylinder holes 124 were formed so as to expose portions of the upper surfaces of capacitive contact plugs 122 formed in second interlayer insulating film 120.

Thereafter, lower electrodes 125 was formed so as to cover the inner surfaces of cylinder holes 124, and, further, capacitive insulating film 126 was formed on an entire surface of the resultant structure so as to cover lower electrodes 125. Then, upper electrode 127 was formed on an entire surface of the resultant structure so as to fill into remaining cavities within the cylinder holes. Next, upper electrode 127 and capacitive insulating film 126 were patterned using lithography and dry etching methods. One portion of upper electrode 127 was drawn into peripheral circuit region B so as to form drawn interconnection 129.

Contact holes 121 are holes for forming capacitive contact plugs 122 interconnecting contact plugs 116 and lower electrodes 125 of the capacitors with each other. Contact holes 121 were formed in second interlayer insulating film 120 between contact plugs 116 and lower electrodes 125 of the capacitors. Cylinder holes 124 were formed in third interlayer insulating film 123 as holes for forming the capacitors in a three-dimensional way.

Next, using a CVD method, fourth interlayer insulating film 128 was formed on an entire surface of the resultant structure so as to cover upper electrode 127 and drawn interconnection 129 and, thereafter, the surface of the resultant structure was planarized using CMP method. Then, in peripheral circuit region B, contact hole 132 was formed using the method of the invention. Contact hole 132 was formed so as to penetrate through the second to fourth interlayer insulating films and expose portions of upper surfaces of first interconnections 119. At this time, contact hole 130 exposing drawn interconnection 129 may be formed at the same time. Since contact hole 130 has a small depth, it is possible to form it without using the method of the invention.

Subsequently, using a CVD method, conductive material was formed on an entire surface of the resultant structure so as to fill into contact holes 132, 130. Then, the conductive material formed on the upper surface of the fourth interlayer insulating film was removed using a CMP method, thereby forming contact plugs 133, 131. Next, a second interconnection layer was formed on an entire surface of the resultant structure using a sputtering method, and, then, second interconnections 134, 135 were formed using lithography and dry etching methods.

Contact holes 132 was formed in a such way as to penetrate through the second to fourth interlayer insulating film between first interconnections 119 and second interconnection 135. Contact holes 132 are holes for forming contact plug 133 interconnecting the lower conductive layers including first interconnection 119 and the upper conductive layers including second interconnection 135.

As mentioned above, in manufacturing the semiconductor device, contact plug is required to interconnect lower conductive layer and upper conductive layer with each other. Accordingly, it is necessary to form the contact holes having few variation between the diameters thereof in order to improve reliability of the contact plugs, with high precision.

Further, in the DRAM including the capacitors, there are needs to form the cylinder holes with a high aspect ratio (the smaller the diameter thereof and the larger the depth thereof, then, the higher the aspect ratio thereof) or to form the contact holes for the peripheral circuit region which are deeper than the cylinder holes. To deal with such miniaturization of semiconductor device, employing of the liquid immersion exposure apparatus using as its light source ArF laser with short wavelength has been studied in the photolithography technique, and, now, it is possible to form a fine pattern with 60 nm or smaller than 60 nm of a minimum processing dimension.

However, in the exposure apparatus including super-precise parts, there potentially occurs certain variation between sizes in the resist pattern formed by the exposure apparatus, and, further, as the pattern becomes finer, relative ratio of the variation to an entire region of the pattern may increase. The inventor confirms in an experimental manner that the variation between the hole diameters comes into a substantial and explicit problem when the minimum processing dimension of the pattern becomes smaller than 50 nm.

In the present exemplary embodiment, although there appears variation between the opening diameters in the opening pattern formed in the photoresist by the exposure, the variation may reduce in a self-alignment manner by using the method of the exemplary embodiment, to accomplish uniformity between the opening diameters. As a result, holes with uniform or constant diameters may be formed in layer to be opened. For this reason, the problem that bottom portions of the holes are not open or the problem resulting from the over-etching may be avoided. Furthermore, this exemplary embodiment can exhibit considerable effect in particular when it is applied to forming of holes having average diameters of 25 to 50 nm. If the average diameters are smaller than 25 nm, it may be difficult to form the photoresist pattern and transfer the photoresist pattern with high precision. If the average diameters are larger than 50 nm, it has low probability that the variation between the hole diameters come into the substantial and explicit problem.

It is apparent that the present invention is not limited to the above embodiments, but may be modified and changed without departing from the scope and spirit of the invention.

In addition, while not specifically claimed in the claim section, the applications reserve the right to include the following method for manufacturing a semiconductor device in the claim section at any appropriate time:

1. A method for manufacturing a semiconductor device, comprising:
   forming lower conductive layers;
   forming an interlayer insulating film on the lower conductive layers;
   forming a second mask layer and a first mask layer in this order on the interlayer insulating film;
   patterning the first and second mask layers to form openings at positions corresponding to the lower conductive layers in the first and second mask layers;
   enlarging diameters of the openings in the second mask layer so that the diameters of the openings in the second mask layer become larger than diameters of the openings in the first mask layer;
   depositing mask material into the openings in the first and second mask layers so that cavities are formed within the openings in the second mask layer;
   etching back the first mask layer and the mask material so that the second mask layer remains, to remove the first mask layer and to expose the cavities in the second mask layer;
   removing the mask material from bottom surfaces of the cavities in a thickness direction of the mask material until the interlayer insulating film is exposed, to form a mask which includes the second mask layer and the mask material and has the openings including the cavities at positions corresponding to the lower conductive layers on the interlayer insulating film;
   etching the interlayer insulating film using the mask, to form contact holes in the interlayer insulating film and beneath the openings of the mask;
   filling conductive material into the contact holes to form contact plugs; and
   forming upper conductive layers so as to be electrically connected to the contact plugs.

2. The method for manufacturing a semiconductor device according to the above 1,
   wherein diameters of the cavities are in a range of 25 to 50 nm.

3. The method for manufacturing a semiconductor device according to the above 1,
   wherein the first mask layer is a silicon-containing organic film.

4. The method for manufacturing a semiconductor device according to the above 1,
   wherein the second mask layer is an organic anti-reflection film.

5. The method for manufacturing a semiconductor device according to the above 1,
   wherein in enlarging the diameters of the openings in the second mask layer, the second mask layer is dry etched using oxygen gas as etching gas.

6. The method for manufacturing a semiconductor device according to the above 1,
   wherein in forming the lower conductive layers, a MOS transistor is formed, the MOS transistor including source/drain regions as the lower conductive layers.

7. The method for manufacturing a semiconductor device according to the above 1,
   wherein in forming the lower conductive layers, lower interconnection layers are formed as the lower conductive layers.

8. The method for manufacturing a semiconductor device according to the above 1,
   wherein in forming the upper conductive layers, upper interconnection layers are formed as the upper conductive layers.

9. The method for manufacturing a semiconductor device according to the above 1,
   wherein in forming the interlayer insulating film, at least one interlayer insulating layer is formed.

10. A method for manufacturing a semiconductor device, comprising:
    forming lower conductive layers;
    forming an interlayer insulating film, a second film, a first film, a second mask layer, and a first mask layer in this order on the lower conductive layers;
    patterning the first and second mask layers to form openings at positions corresponding to the lower conductive layers in the first and second mask layers;
    enlarging diameters of the openings in the second mask layer so that the diameters of the openings in the second mask layer become larger than diameters of the openings in the first mask layer;
    depositing mask material into the openings in the first and second mask layers so that cavities are formed within the openings in the second mask layer;
    etching back the first mask layer and the mask material so that the second mask layer remains, to remove the first mask layer and to expose the cavities in the second mask layer;
    removing the mask material from bottom surfaces of the cavities in a thickness direction of the mask material until the first film is exposed, to form a mask which includes the second mask layer and the mask material and has the openings including the cavities at positions corresponding to the lower conductive layers on the first film;
    etching the first film using the mask, to form first holes in the first film and beneath the openings of the mask;
    removing the mask;
    etching the second film using the first film as an mask for etching, to form second holes in the second film;
    removing the first film; and
    etching the interlayer insulating film using the second film as an mask for etching, to form contact holes in the interlayer insulating film.

11. The method for manufacturing a semiconductor device according to the above 10,
    wherein the first film is a silicon oxynitride film.

12. The method for manufacturing a semiconductor device according to the above 10,
    wherein the second film is an amorphous carbon film.

13. A method for manufacturing a semiconductor device, comprising:
    forming a second mask layer and a first mask layer in this order on a first film;
    patterning the first and second mask layers to form openings in the first and second mask layers;
    enlarging diameters of the openings in the second mask layer so that the diameters of the openings in the second mask layer become larger than diameters of the openings in the first mask layer;
    depositing mask material into the openings in the first and second mask layers so that cavities are formed within the openings in the second mask layer;
    etching back the first mask layer and the mask material so that the second mask layer remains, to remove the first mask layer and to expose the cavities in the second mask layer;
    removing the mask material from bottom surfaces of the cavities in a thickness direction of the mask material until the first film is exposed, to form a mask which includes the second mask layer and the mask material and has the openings including the cavities on the first film;
    forming cylinder holes in the first film using the mask; and forming lower electrodes, capacitive insulating films, and upper electrodes in this order on inner walls of the cylinder holes, to form capacitors.

14. The method for manufacturing a semiconductor device according to the above 13, wherein diameters of the cavities are in a range of 25 to 50 nm.

15. The method for manufacturing a semiconductor device according to the above 13, wherein the first mask layer is a silicon-containing organic film.

16. The method for manufacturing a semiconductor device according to the above 13, wherein the second mask layer is an organic anti-reflection film.

17. The method for manufacturing a semiconductor device according to the above 13, wherein in enlarging the diameters of the openings in the second mask layer, the second mask layer is dry etched using oxygen gas as etching gas.

What is claimed:

1. A method for manufacturing a semiconductor device, comprising:
    forming lower conductive layers;
    forming an interlayer insulating film on the lower conductive layers;
    forming a second mask layer and a first mask layer in this order on the interlayer insulating film;
    patterning the first and second mask layers to form openings at positions corresponding to the lower conductive layers in the first and second mask layers;
    enlarging diameters of the openings in the second mask layer so that the diameters of the openings in the second mask layer become larger than diameters of the openings in the first mask layer;
    depositing mask material into the openings in the first and second mask layers so that cavities are formed within the openings in the second mask layer;
    etching back the first mask layer and the mask material so that the second mask layer remains, to remove the first mask layer and to expose the cavities in the second mask layer;
    removing the mask material from bottom surfaces of the cavities in a thickness direction of the mask material until the interlayer insulating film is exposed, to form a mask which includes the second mask layer and the mask material and has the openings including the cavities at positions corresponding to the lower conductive layers on the interlayer insulating film;
    etching the interlayer insulating film using the mask, to form contact holes in the interlayer insulating film and beneath the openings of the mask;
    filling conductive material into the contact holes to form contact plugs; and forming upper conductive layers so as to be electrically connected to the contact plugs.

2. The method for manufacturing a semiconductor device according to claim 1, wherein diameters of the cavities are in a range of 25 to 50 nm.

3. The method for manufacturing a semiconductor device according to claim 1, wherein the first mask layer is a silicon-containing organic film.

4. The method for manufacturing a semiconductor device according to claim 1, wherein the second mask layer is an organic anti-reflection film.

5. The method for manufacturing a semiconductor device according to claim 1, wherein in enlarging the diameters of the openings in the second mask layer, the second mask layer is dry etched using oxygen gas as etching gas.

6. The method for manufacturing a semiconductor device according to claim 1, wherein in forming the lower conductive layers, a MOS transistor is formed, the MOS transistor including source/drain regions as the lower conductive layers.

7. The method for manufacturing a semiconductor device according to claim 1, wherein in forming the lower conductive layers, lower interconnection layers are formed as the lower conductive layers.

8. The method for manufacturing a semiconductor device according to claim 1, wherein in forming the upper conductive layers, upper interconnection layers are formed as the upper conductive layers.

9. The method for manufacturing a semiconductor device according to claim 1, wherein in forming the interlayer insulating film, at least one interlayer insulating layer is formed.

10. A method for manufacturing a semiconductor device, comprising: forming lower conductive layers;
    forming an interlayer insulating film, a second film, a first film, a second mask layer, and a first mask layer in this order on the lower conductive layers;
    patterning the first and second mask layers to form openings at positions corresponding to the lower conductive layers in the first and second mask layers;
    enlarging diameters of the openings in the second mask layer so that the diameters of the openings in the second mask layer become larger than diameters of the openings in the first mask layer;
    depositing mask material into the openings in the first and second mask layers so that cavities are formed within the openings in the second mask layer;
    etching back the first mask layer and the mask material so that the second mask layer remains, to remove the first mask layer and to expose the cavities in the second mask layer; removing the mask material from bottom surfaces of the cavities in a thickness direction of the mask material until the first film is exposed, to form a mask which includes the second mask layer and the mask material and has the openings including the cavities at positions corresponding to the lower conductive layers on the first film;
    etching the first film using the mask, to form first holes in the first film and beneath the openings of the mask;
    removing the mask;
    etching the second film using the first film as an mask for etching, to form second holes in the second film;
    removing the first film; and
    etching the interlayer insulating film using the second film as an mask for etching, to form contact holes in the interlayer insulating film.

11. The method for manufacturing a semiconductor device according to claim 10, wherein the first film is a silicon oxynitride film.

12. The method for manufacturing a semiconductor device according to claim 10, wherein the second film is an amorphous carbon film.

13. A method for manufacturing a semiconductor device, comprising: forming a second mask layer and a first mask layer in this order on a first film; patterning the first and second mask layers to form openings in the first and
    second mask layers;
    enlarging diameters of the openings in the second mask layer so that the diameters of the openings in the second mask layer become larger than diameters of the openings in the first mask layer;

depositing mask material into the openings in the first and second mask layers so that cavities are formed within the openings in the second mask layer;

etching back the first mask layer and the mask material so that the second mask layer remains, to remove the first mask layer and to expose the cavities in the second mask layer; and removing the mask material from bottom surfaces of the cavities in a thickness direction of the mask material until the first film is exposed, to form a mask which includes the second mask layer and the mask material and has the openings including the cavities on the first film.

14. The method for manufacturing a semiconductor device according to claim 13, wherein diameters of the cavities are in a range of 25 to 50 nm.

15. The method for manufacturing a semiconductor device according to claim 13, wherein the first mask layer is a silicon-containing organic film.

16. The method for manufacturing a semiconductor device according to claim 13, wherein the second mask layer is an organic anti-reflection film.

17. The method for manufacturing a semiconductor device according to claim 13, wherein in enlarging the diameters of the openings in the second mask layer, the second mask layer is dry etched using oxygen gas as etching gas.

18. The method for manufacturing a semiconductor device according to claim 13, further comprising, forming cylinder holes in the first film using the mask, and forming lower electrodes, capacitive insulating films, and upper electrodes in this order on inner walls of the cylinder holes, to form capacitors.

* * * * *